United States Patent [19]

Forestieri et al.

[11] 3,780,424

[45] Dec. 25, 1973

[54] METHOD OF MAKING SILICON SOLAR CELL ARRAY

[75] Inventors: Americo F. Forestieri, Berea; Jacob D. Broder, Cleveland Heights; Daniel T. Bernatowicz, Parma, all of Ohio

[73] Assignee: The United States of America as represented by the Administrator of the National Aeronautics and Space Administration, Washington, D.C.

[22] Filed: Oct. 26, 1970

[21] Appl. No.: 83,816

[52] U.S. Cl. .......................... 29/572, 136/89, 29/588

[51] Int. Cl. .............................................. H01l 15/02

[58] Field of Search .......................... 136/89; 29/572

[56] References Cited

UNITED STATES PATENTS

| | | | |
|---|---|---|---|
| 2,946,763 | 7/1960 | Bro et al. | 260/45.5 |
| 3,062,793 | 11/1962 | Eleuterio | 260/87.5 |
| 3,571,915 | 3/1971 | Shirland | 136/89 X |
| 3,562,020 | 2/1971 | Blevins | 136/89 |
| 3,375,141 | 3/1968 | Julius | 136/89 |
| 3,411,050 | 11/1968 | Middleton et al. | 136/89 X |
| 3,483,038 | 12/1969 | Hui et al. | 136/89 |
| 3,375,136 | 3/1968 | Biggar | 136/89 X |

*Primary Examiner*—A. B. Curtis
*Attorney*—N. T. Musial, G. E. Shook and John R. Manning

[57] ABSTRACT

A heat sealable transparent plastic film, such as a fluorinated ethylene propylene copolymer, is used both as a cover material and as an adhesive for mounting a solar cell array to a flexible substrate.

2 Claims, 2 Drawing Figures

INVENTORS
AMERICO F. FORESTIERI
JACOB BRODER
DANIEL T. BERNATOWICZ
BY
Norman T. Musial
Gene E. Shook
ATTORNEYS

METHOD OF MAKING SILICON SOLAR CELL ARRAY

ORIGIN OF THE INVENTION

The invention described herein was made by employees of the United States Government and may be manufactured and used by or for the Government for governmental purposes without the payment of any royalties thereon or therefor.

BACKGROUND OF THE INVENTION

This invention is concerned with an improved solar cell array. The invention is particularly directed to mounting an array of silicon solar cells on a flexible substrate to form a module.

Large arrays of solar cells are required for space vehicles having power levels in the multikilowatt range. By way of example, it is contemplated that a space station will require about 25 kilowatts of power. Such large solar cell arrays may utilize flexible substrates to enable them to be rolled or folded for storage during the launch phase.

Protective covers are also required for photovoltaic devices that are used in space. For example, silicon solar cells are covered with quartz or other transparent glasses to aid in the dissipation of heat from the illuminated cell and to minimize damage from bombarding particles as set forth in U.S. Pat. No. 3,472,698. Such cells and covers are generally rigid which makes them undesirable for flexible arrays where a large number of cells must be stored during launch and subsequently deployed in space.

SUMMARY OF THE INVENTION

These problems have been solved by a sandwich of solar cells covered and mounted in accordance with the present invention. A heat sealable transparent plastic film, such as a fluorinated ethylene propylene copolymer, is utilized both as the protective cover and as the adhesive for mounting solar cells to a flexible substrate. A laminate comprising the substrate, a plastic film adhesive layer, the solar cell array, and a plastic film cover layer is bonded in a heated press.

OBJECTS OF THE INVENTION

One object of the present invention is to provide a laminated solar cell array that is sealed and insulated against high voltage.

Another object of the invention is to provide a silicon solar cell array that has a flexible mounting substrate.

A further object of the invention is to provide a silicon solar cell array that is protected from particulate radiation, such as electrons and protons.

Still another object of the invention is to provide a laminated solar cell array wherein the interconnections between cells are made when the array is laminated.

These and other objects of the invention will be apparent from the specification which follows and from the drawing wherein like numerals are used throughout to identify like parts.

DESCRIPTION OF THE PREFERRED EMBODIMENT

Figure 1:
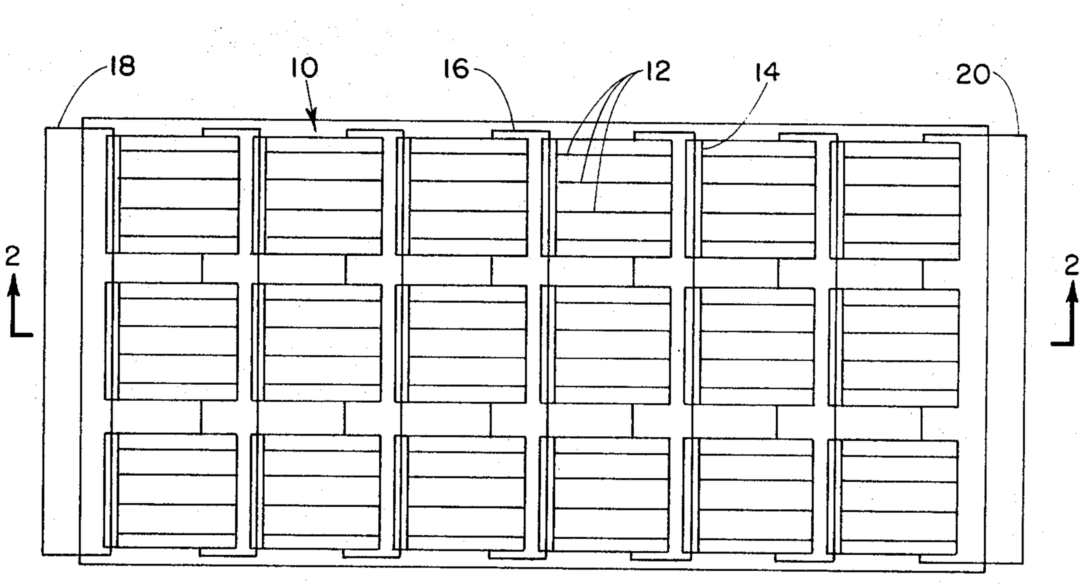
FIG. 1 is a plan view of a module of solar cells protected in accordance with the present invention.

Referring now to the drawings there is shown a module comprising a small array of solar cells 10 covered in accordance with the present invention. Each of the solar cells 10 has a grid as best shown in FIG. 1 for collecting current from the cell. A grid comprised of a plurality of fingers 12 terminating at a bus bar 14 extending along one end of each cell 10 is satisfactory.

Figure 2:
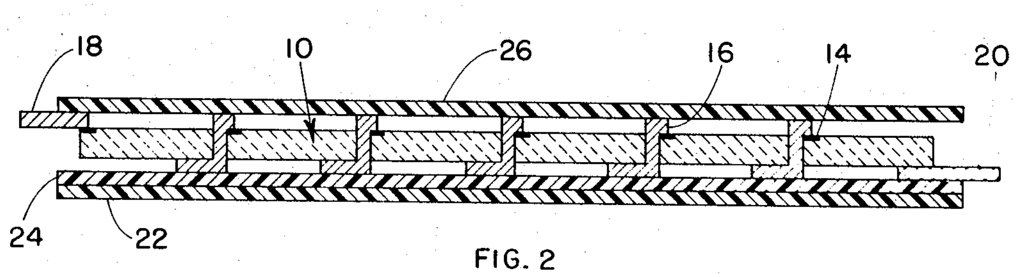
FIG. 2 is an enlarged sectional view taken along the line 2—2 in FIG. 1 showing the module of solar cells prior to lamination.

Connecting strips 16 are used to electrically interconnect adjacent cells in each row as well as adjacent rows of cells as shown in FIG. 1. Each connecting strip 16 may be a thin layer of metal foil or it may be expanded metal mesh. A connecting strip contacts each of the bus bars 14 along the upper surface of a row of solar cells 10. This same connecting strip extends between adjacent rows of cells and is in contact with a portion of the lower surface of each cell in an adjacent row as shown in FIG. 2.

A lead 18 extends outward from the array at one end of the module. The lead 18 may be a strip of foil or expanded metal. This lead strip contacts all of the bus bars 14 in the end row of solar cells of each module as shown in FIG. 1.

A similar lead 20 extends outward from the module at the opposite end from the lead 18. This lead is also in the form of a strip of foil or expanded metal. As shown in FIG. 2 the lead 20 is in contact with the lower surface of each cell 10 in the end row.

According to the present invention all the solar cells 10 in the array forming the module are mounted on a flexible substrate 22. A polyimide film, known commercially as Kapton, has been used for the substrate 22.

The cells 10 are bonded to the substrate 22 by a layer 24 of adhesive material, such as a copolymer of fluorinated ethylene propylene. A fluorinated ethylene propylene copolymer, described in U.S. Pat. No. 2,946,763 and known commercially as Teflon FEP, has been satisfactory for this purpose. A substrate in the form of a 1 mil thick sheet of Kapton has been bonded to an array of silicon solar cells by a 2 mil thick sheet of FEP Teflon.

A cover 26 is provided for protecting the solar cells 10 as well as the connectors 16 from erosion and the like. A copolymer cover 26 of fluorinated ethylene propylene has been satisfactory. A cover in the form of a 5 mil thick sheet of fluorinated ethylene propylene copolymer known commercially as Teflon FEP has been successful.

Solar cell modules were fabricated in accordance with the invention by interconnecting the solar cells 10 with connecting strips 16 which were either expanded silver mesh or strips of aluminum foil. The solar cells had thicknesses up to 8 mils, and the electrical interconnections were made by either ultrasonic binding or thermal diffusion bonding. If desired, the connecting strips 16 may be positioned in contact with the cells 10 prior to laminating. In this case the connections are made when the sandwich is laminated.

After the cells were interconnected the modules were placed in a press to form a laminated sandwich. The press served not only as a heat source but also as a container for platens to produce the modules. To eliminate breakage of solar cells and produce void free modules, a combination of vacuum and pressure was used with the laminating press.

All of the components of each module were cleaned by boiling in alcohol for one minute. The press was closed and preheated to about 300° C. The platens were opened and a vacuum was applied. A 5 mil thick sheet of a porous material, such as Armalon, was placed over the base platen to act as a release agent to prevent the FEP Teflon from sticking.

First a 1 mil thick sheet of the substrate material, Kapton, was placed on the release agent, Armalon. A 2 mil thick sheet of the bonding material 24 was then placed over the substrate. As stated above, the bonding material was FEP Teflon.

The previously interconnected array of solar cells was then placed over the bonding material 24. A sheet of cover material 26 was placed over the solar cell array. A 5 mil thick sheet of FEP Teflon was satisfactory for this purpose. This Teflon sheet had one side treated for better bonding, and this treated side faced the solar cells 10 in the array.

A release agent was then placed in contact with the cover material 26. A 1 mil sheet of skived FEP Teflon served as a satisfactory release agent. A vacuum seal was then placed over the release agent. A 5 mil sheet of aluminum has been satisfactory for the vacuum seal. This aluminum sheet also served to apply pressure to the solar cells. The top half of the platen was placed in position, and the two platen halves were bolted together.

The laminating press was opened and the platens were inserted. The press was then closed and hydraulic pressure of about 300 psi was applied. This pressure was not applied to the solar cells 10 but only to the platens to hold them together.

Nitrogen gas pressure up to 100 psi was applied to the top half of the platen. This pressure was transmitted to the solar cells 10 by the aluminum sheet. The platens were heated to about 290° C, and this temperature was maintained for about 5 minutes. It is contemplated that other pressures and temperatures may be used.

Cold water was then flowed through the press for quick cooling. After cooling, the platens were removed from the press. The laminated modules were removed by opening the platens.

Sandwich modules made in this manner have passed thermal cycling tests from 40° to −125° C. Radiation tests equivalent to 3,600 hours of sun ultraviolet irradiation reduced the cell output only 2 to 3 percent.

While the preferred embodiment of the invention has been described it will be appreciated that various modifications may be made to the structure and procedure without departing from the spirit of the invention or the scope of the subjoined claims. More particularly, the module as shown in the drawing has three cells in parallel and six cells in the series. Various other size modules may be used. The size of the cells and the modules may be altered, and the process is equally applicable to larger or smaller cells as well as other thicknesses of the layers of Kapton and FEP Teflon. The invention is also useful for fabricating rigid solar cell arrays. The flexible substrate is replaced by a rigid substrate in this alternate embodiment.

We claim:

1. A method of making a module of rigid silicon solar cells in an array having adjacent rows electrically connected with metal strips on a flexible substrate comprising the steps of positioning said substrate on a first preheated platen, covering said substrate with a first film of a fluorinated ethylene propylene copolymer, arranging said solar cells in rows to form an array on said first film, placing one of said metal strips between each of said rows, said metal strips being in contact with the upper surface of one row of cells and the lower surface of an adjacent row of cells, covering said array of solar cells with a second film of fluorinated ethylene propylene copolymer, placing a vacuum seal over said second film, positioning a second preheated platen over said vacuum seal, applying hydraulic pressure to said first and second platens, applying gas pressure to said second platen, said pressure being transmitted to said array of solar cells through said vacuum seal, maintaining said platens in a heated condition while said gas pressure is applied to form a laminate and electrically connect adjacent solar cells, and cooling said laminate to ambient temperature.

2. A method as claimed in claim 1 wherein the heat and pressure are applied in a press.

* * * * *